US006426786B1

(12) United States Patent
Lu et al.

(10) Patent No.: US 6,426,786 B1
(45) Date of Patent: Jul. 30, 2002

(54) METHOD OF HOMEOTROPIC ALIGNMENT OR TILTED HOMEOTROPIC ALIGNMENT OF LIQUID CRYSTALS BY SINGLE OBLIQUE EVAPORATION OF OXIDES AND LIQUID CRYSTAL DISPLAY DEVICE FORMED THEREBY

(75) Inventors: Minhua Lu, Mohegan Lake; Kei-Hsiung Yang, Katonah, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/323,044

(22) Filed: Jun. 1, 1999

(51) Int. Cl.$^7$ ............................................. G02F 1/1337

(52) U.S. Cl. ....................................... 349/125; 349/129

(58) Field of Search ................................. 349/129, 130, 349/131, 125, 123, 144, 158, 160

(56) References Cited

U.S. PATENT DOCUMENTS

| | | | | |
|---|---|---|---|---|
| 4,030,997 A | * | 6/1977 | Miller et al. | 204/192 |
| 4,247,174 A | * | 1/1981 | Walter | 350/340 |
| 4,490,015 A | * | 12/1984 | Kawarada et al. | 350/340 |
| 4,957,349 A | * | 9/1990 | Clerc et al. | 350/333 |
| 5,268,781 A | | 12/1993 | Shigeta et al. | |
| 5,620,755 A | | 4/1997 | Smith, Jr. et al. | |
| 5,658,439 A | | 8/1997 | Burkle et al. | |
| 5,745,205 A | * | 4/1998 | Kato et al. | 349/125 |
| 5,767,827 A | | 6/1998 | Kobayashi et al. | |
| 5,858,276 A | | 1/1999 | Iwasaki et al. | |
| 5,859,682 A | * | 1/1999 | Kim et al. | 349/124 |
| 6,061,116 A | * | 5/2000 | Nishida et al. | 349/130 |
| 6,141,074 A | * | 10/2000 | Bos et al. | 349/129 |

OTHER PUBLICATIONS

A. Takeda, S. Kataoka, T. Sasaki, H. Chida, H. Tsuda, K. Ohmuro, Y. Koike, T. Sasabayashi, K. Okamoto, "41.1: A Super–High–Image–Quality Multi–Domain Vertical Alignment LCD by New Rubbing–Less Technology" May 17–22, 1998, SID '98 Digest, p. 1077–1080.*
H. Vithana, Y.K. Fung, S.H. Jamal, R. Herke, P.J. Bos, D.L. Johnson, "41.3: A Well–Controlled Tilted–Homeotropic Alignment Method and a Vertically Aligned Four–Domain LCD Fabricated by This Technique" May 1995, SID '95 Digest, p. 873–876.*
V.A. Konovalov, A.A. Muravski, C.N. Timofeev, S. Ye Yakovenko, "44.2L: Multi–Domain Vertically Aligned Mode" May 17–22, 1998, SID '98 Digest, p. 1127–1130.*
T. Uchida and H. Seki, "Surface Alignment of Liquid Crystals," Chapter 5 of Liquid Crystals: Applications and Uses, vol. 3, edited by B. Bahadur, World Scientific, 1995, pp. 21–25, 34, 44–45, 48–49, 60–63.*
Lu et al., "Homeotropic Alignment by Single Oblique Evaporation of SiO2 and its Application to High Resolution Microdisplays", 2000 SID Digest.*

* cited by examiner

Primary Examiner—Toan Ton
Assistant Examiner—Andrew Schechter
(74) Attorney, Agent, or Firm—Gail H. Zarick, Esq.; McGinn & Gibb, PLLC

(57) ABSTRACT

A single-domain, two-domain or four-domain homeotropic- or tilted homeotropic-alignment liquid crystal display device of either the transmissive-type or reflective-type having a high contrast ratio, a good display quality, and a high photo-stability (and a method of producing the same), includes a homeotropic- or tilted homeotropic-alignment layer which includes an oxide layer prepared by a single oblique evaporation of an activated oxide source. The angle between the evaporation direction and the substrate plane forms an angle from about ±20° to about ±90°, and the thickness of the oxide layer is from about 10 nm to about 200 nm. A method of homeotropic-alignment or tilted homeotropic-alignment of liquid crystals by a single oblique evaporation process is also provided.

35 Claims, 3 Drawing Sheets

METHOD OF HOMEOTROPIC ALIGNMENT OR TILTED HOMEOTROPIC ALIGNMENT OF LIQUID CRYSTALS BY SINGLE OBLIQUE EVAPORATION OF OXIDES AND LIQUID CRYSTAL DISPLAY DEVICE FORMED THEREBY

BACKGROUND OF THE INVENTION

1. Field of the Invention

The present invention generally relates to a liquid crystal display (LCD) device.

More particularly, the present invention relates to a homeotropic-alignment or a tilted homeotropic-alignment LCD device of either a single-domain-type, a two-domain-type, or a four-domain type for use in a flat panel display, a projection display, and a method of producing such homeotropic-alignment or tilted homeotropic-alignment liquid crystal display devices, in which improvements in the display quality and mass production capability of the homeotropic-alignment or the tilted homeotropic-alignment liquid crystal display devices are achieved.

2. Description of the Related Art

In homeotropic-alignment liquid crystal display devices, a nematic liquid crystal having a negative dielectric anisotropy is used. Liquid crystal molecules, nearly homeotropically aligned with respect to substrate surfaces, are caused to tilt by a drive voltage, whereupon a display operation begins.

With this construction, if the molecule tilt direction is not uniform in the activated state, a remarkable non-uniformity in brightness is observed. To avoid this phenomenon, a small pre-tilt angle is typically provided when a liquid crystal homeotropic-alignment is achieved. However, as the pre-tilt angle increases, the contrast ratio and the threshold level decrease with an increase in pre-tilt angle. This is problematic in that the liquid crystal molecule is a birefringent molecule and depends on its orientation.

The pre-tilt angle may be provided by using an angle-deposited film (e.g., a film formed by an angle vapor deposition process also referred to as an "oblique evaporation process"). The angle vapor deposition process is a process used for aligning liquid crystal molecules, wherein the vapor of an oxide, such as SiO, is deposited on a substrate surface from an oblique direction. However, the pre-tilt angle should be larger than about 0.50°. Otherwise, if the drive voltage undergoes a sudden change, then the liquid crystal molecules may tilt in diametrically opposite directions. This phenomenon is observed as a dynamic alignment defect. The pre-tilt angle cannot exceed a certain value. Otherwise, the birefringence due to the pre-tilt of the liquid crystal molecules will cause a light leakage in a dark state and reduce the contrast ratio.

To solve this problem, a two-step angle vapor deposition process, such as disclosed in Japanese Patent Publication No. 55-13338, has been proposed as a process which is suitable for controlling the molecule tilt direction of the liquid crystal.

However, the above-mentioned conventional angle vapor deposition process has a problem that the pre-tilt angle varies greatly with a slight change in film thickness or incident angle.

As is also reported in *Proceedings of the SID*, Vol. 31/4, page 321 (1990), when the angle vapor deposition process is used in the production of liquid crystal light valves, a great change in the contrast ratio is observed with a slight change in the pre-tilt angle. This phenomenon will bring about the occurrence of non-uniform liquid crystal alignment and an inadequate reproducibility problem.

According to another conventional alignment method as disclosed in Japanese Patent Laid-open Publication No. 51-129251, an $SiO_2$ film deposited on a substrate is etched off by an Argon ion beam directed obliquely onto the $SiO_2$ film, so as to produce a surface profile change which is used for liquid crystal alignment. Due to a large etch-off amount, this alignment method is time-consuming. Further, a simple ion beam etching effected in an oblique direction may cause an alignment non-uniformity problem in the activated state. This problem is particularly significant for a high resolution spatial light modulator (SLM) constructed to display dynamic images.

According to another conventional alignment method, it involves two glass substrates having patterned transparent electrodes being set obliquely at a first angle with respect to an evaporation source. Then, a first $SiO_2$ film is deposited on each of the glass substrates while irradiating the glass substrates with an ion beam emitted from an ion gun.

Subsequently, the glass substrates are turned in their plane over an angle of 90° and set obliquely at a second angle with respect to the evaporation source. Thereafter, a second $SiO_2$ film is deposited on the respective first $SiO_2$ films while irradiating the first $SiO_2$ film with the ion beam. The first and second $SiO_2$ films thus deposited on the glass substrates jointly form a homeotropic-alignment undercoat film. A homeotropic alignment agent is applied to the undercoat film, and thereafter the glass substrates are assembled together via spacers and filled with a liquid crystal.

However, as evident from the description above, the processing steps to form tilted homeotropic alignment of liquid crystals are very complicated, involving ion-beam assisted two-step oblique evaporations of $SiO_2$ with an orientation change of substrates between two oblique evaporations and the application of the homeotropic alignment film on top of the $SiO_2$ films. The manufacturing cost to produce such homeotropic alignment layers is high, and the throughput is low because of the complicated process steps.

Another conventional method to form stable tilted homeotropic alignment in liquid crystals involves depositing a layer of silica upon the substrate by in-line magnetron sputtering as the substrate is moved past the sputtering target. Thereafter, the silica-coated substrate is coated with a long-chain alcohol to induce the liquid crystal director assuming a field-off state tilted about 1° to 3° from the perpendicular direction toward an azimuthal direction parallel to the direction of movement of the substrate during sputtering.

A similar conventional alignment method describes a deformation of aligned phase (DAP) mode liquid crystal display panel of a homeotropic structure type. The alignment films are formed so that a homeotropic orientation of the liquid crystal is achieved by a combination of oblique vacuum deposition and a perpendicular orientating processing agent.

However, both conventional approaches require two layers of films, thereby requiring additional processing steps.

That is, a first layer of dielectric film either by sputtering or oblique evaporation and a second layer of homeotropic aligning agent, are required. The second layer of homeotropic aligning film is usually made of organic material, such as a long-chain alcohol which will be photo-degradable by ultraviolet, violet, or blue light impinging thereon, either from a back-light or a projection light source, to change the pre-tilt angle of the adjacent liquid crystal molecules. As a result, the display image will be defective or the display will have a decreasing contrast ratio as a function of illumination dosage.

SUMMARY OF THE INVENTION

In view of the foregoing and other problems of the conventional methods and structures, an object of the present invention is to provide a photo-stable homeotropic-alignment or tilted homeotropic-alignment liquid crystal display unit which is free from the occurrence of alignment non-uniformity both in the inactivated state and in the activated state, and which has a high contrast ratio.

Another object of the present invention is to provide a method of making the photo-stable homeotropic or tilted homeotropic-alignment liquid crystal display unit which uses an inorganic material, such as oblique evaporated $SiO_2$, as compared to the conventional techniques of using an organic homeotropic alignment agent, such as long chain alcohols.

Another object of the present invention is to provide a simple and inexpensive method to generate homeotropic or tilted homeotropic liquid crystal alignment.

Another object of the present invention is to provide a method, compatible to semiconductor integrated circuit (IC) processing, of generating homeotropic- or tilted homeotropic-alignment.

According to a first aspect of the present invention, a homeotropic or tilted homeotropic-alignment liquid crystal display device is provided having for example, a glass substrate, or a processed Si wafer substrate, coated with a single layer of $SiO_2$ film by an oblique vacuum evaporation method.

According to second and third aspects of the present invention, a method of producing a homeotropic- or tilted homeotropic-alignment liquid crystal display device having a substrate (e.g., glass or the like) coated with a homeotropic- or tilted homeotropic-alignment film, is provided. The method includes providing a thin-film deposition system having an evaporation source, and holding a substrate obliquely within the thin-film deposition system, such that the normal line on the glass substrate and the evaporation source form an oblique angle. The alignment film can be produced by sputtering, chemical vapor deposition (CVD), plasma-enhanced chemical vapor deposition (PECVD), and other thin-film deposition methods.

Preferably, the materials used inside the evaporation source are inorganic materials, such as silicon dioxide, MgF, $SiN_x$, $SiO_x$, $Al_2O_3$, ZnO, $TiO_2$, $GeO_2$, SiC, amorphous C:H, amorphous Si:H, and the like (or a combination of any one or more of the above-mentioned materials), whose chemical properties are stable under prolonged illumination of UV, violet, or blue light, to form an liquid crystal alignment layer which is photo-stable and which has a long service life.

BRIEF DESCRIPTION OF THE DRAWINGS

The foregoing and other purposes, aspects and advantages will be better understood from the following detailed description of preferred embodiments of the invention with reference to the drawings, in which:

FIG. 5A illustrates a structure having a plurality of protrusions on both substrates o fa display, and FIG. 5B illustrates a structure with protrusions or ridges on one substrate and etched-away stripes on another substrate.

DETAILED DESCRIPTION OF PREFERRED EMBODIMENTS OF THE INVENTION

Figure 1:
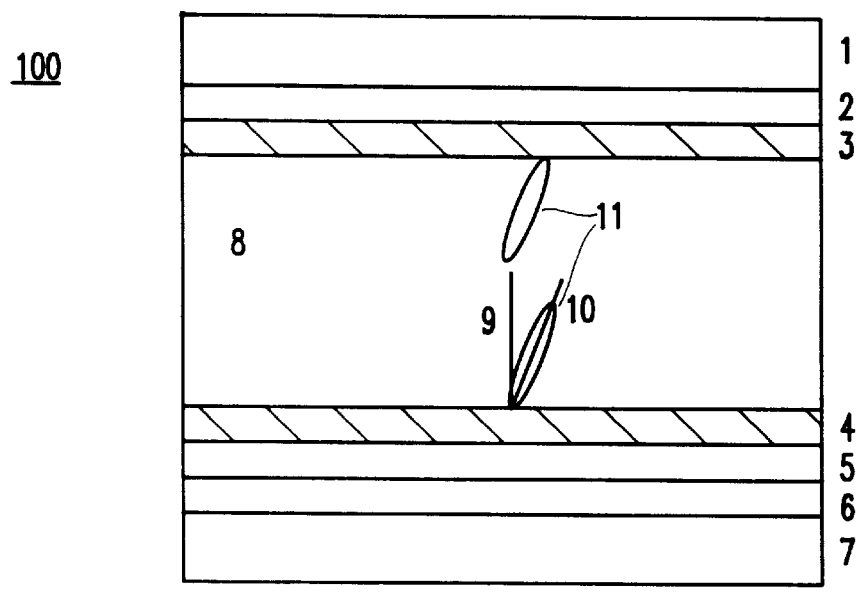
FIG. 1 is a pictorial illustration of transmissive-type and reflective-type tilted homeotropic liquid crystal display panels.

Referring now to the drawings, and more particularly to FIGS. 1–5B, there are shown preferred embodiments of the method and structures according to the present invention FIG. 1 illustrates a schematic diagram of a tilted-homeotropic transmissive-type or reflective-type liquid crystal display cell 100.

The illustrated transmissive-type liquid crystal cell includes transparent substrates 1 and 7 having a thickness substantially within a range of 0.05 mm to 5 mm, and more preferably 0.2 mm–3 mm. The thickness of the two substrates may be different, depending on the type of the materials employed.

Further, transparent electrodes 2 and 5 (reference numeral 6 in FIG. 1 is omitted) are provided having a thickness substantially within a range of 10 Å to 4000 Å, and more preferably 100Å–2000 Å. The thickness of the electrodes may be different, depending on the film properties.

Dielectric films 3 and 4 for liquid crystal alignment are also provided, having a thickness substantially within a range of 10 Å to 2000 Å (e.g., about 2 nm to about 200 nm), and more preferably 100Å–1000 Å (e.g., about 10 nm to about 100 nm). The thickness of the alignment films may be different, depending on the film properties.

Further, a liquid crystal mixture 8 is provided, which may be formed of a liquid crystal material with negative dielectric anisotropy (e.g., the liquid crystal has a-$\Delta\epsilon$)is marketed under the Model No. ZL13612 available from E. M. Merck Corporation, Darmstadt, Germany, or a liquid crystal material marketed under the Model No. MLC 95-465, also available from E. M. Merck Corporation, Darmstadt, Germany. Suitable materials also include any nematic LC mixtures with negative dielectric anisotropy from vendors such as Chisso and Rolic Inc.

The illustrated reflective-type liquid crystal display cell includes a transparent substrate 1 and a solid substrate 7, transparent electrodes 2 and 5 (electrode 5 is optional), a reflective electrode 6, dielectric films 3 and 4 for liquid crystal alignment, and a liquid crystal mixture 8. The thickness of the reflective liquid crystal layer is about one-half of the transmissive liquid crystal layer.

The dielectric films 3 and 4 for liquid crystal alignment and the liquid crystal mixture 8 are common to both the transmissive-type and reflective-type liquid crystal displays.

The function of the dielectric films 3 and 4 is to align the adjacent liquid crystal directors 11 to form a pre-tilt angle α from the normal direction 9 of the substrate plane. The uniformity and the magnitude of the pre-tilt angle a control the display qualities such as contrast ratio and display uniformity.

For high-quality tilted homeotropic transmissive-type or reflective-type liquid crystal display, the magnitude of the pre-tilt angle a is controlled to within about 0.20 to about 10°, and more preferably within about 0.50 to about 5°, with less than about 1° variation across the entire display panel.

With the above structure in mind, a main focus of the present invention is the selection of material and the preparation method to form the dielectric films (e.g., alignment layers) 3, 4 to achieve the proper magnitude and uniformity of the pre-tilt angle α.

Figure 2:
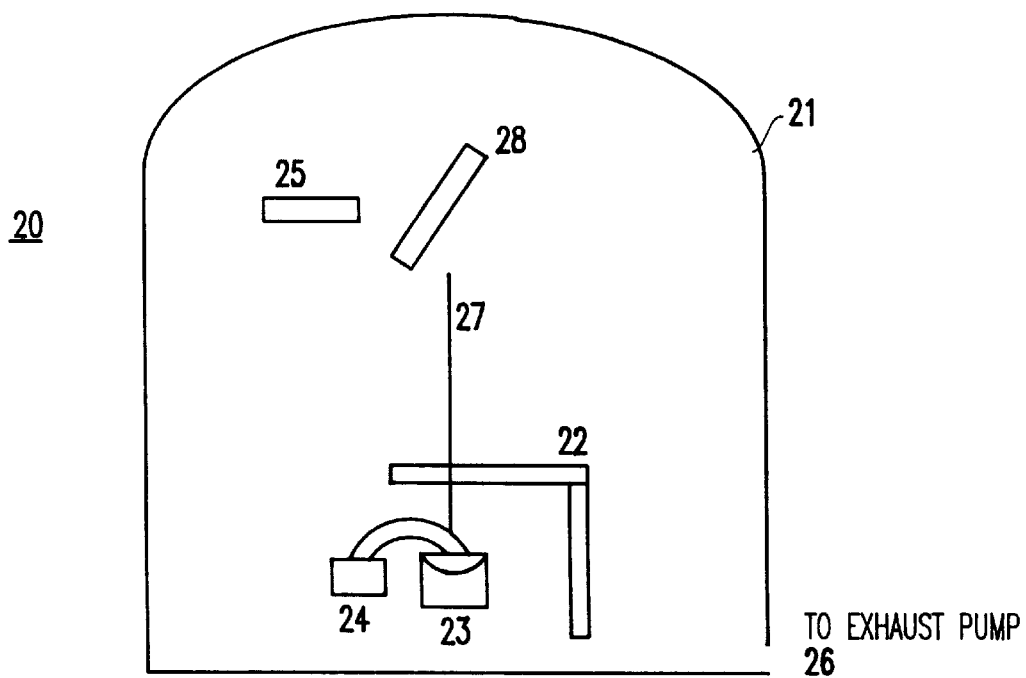
FIG. 2 is a diagrammatic view showing the construction of an apparatus for forming a dielectric alignment film by an angle vapor deposition.

FIG. 2 shows a thin-film deposition system 20 used for forming an angle-deposited film according to the present invention to accomplish the desired alignment for both the transmissive-type or reflective-type liquid crystal displays.

The thin-film deposition system 20 includes a bell jar or vacuum chamber 21 evacuated by an exhaust pump 26. Inside the bell jar or vacuum chamber 20, there are an evaporation target 23, an e-beam source 24, a shutter 22, a film-thickness monitoring device 25 and a substrate (e.g., the workpiece) or substrates 28 for being processed. It is noted that the components of the thin-film deposition system are well-known and commercially available. The preferred materials for the substrates include plastic, ceramic, silicon, glass, etc.

The substrate 28 is held in an oblique direction (e.g., a preferred range of angles being between about 10 degrees to about 90 degrees, and preferably 20 degrees to about 90 degrees) and directly above the evaporation source 23 with preferably a distance greater than about 10 inches between them.

With the shutter 22 open, the liquid crystal alignment layer on the substrate 28 is formed by a single vapor deposition from the target source 23 excited by the e-beam source 24 at a fixed evaporation angle. Preferably, the angle between the evaporation beam direction 27 and the substrate plane 28, is chosen between a range of about 20° to about 90°. Thus, the invention requires only a single vapor deposition process, unlike the conventional methods.

The magnitude of the pre-tilt angle a in a tilted homeotropic liquid crystal cell with its alignment layers prepared by the above method depends on the target material, the evaporation angle, the thickness of the alignment films, and the nematic liquid crystal mixture having either a positive or a negative dielectric anisotropy.

The uniformity of the pre-tilt angle a depends on the substrate size with respect to the distance between the substrate and the target. For one experiment conducted by the present inventors, silicon dioxide was selected as the target material (e.g., the preferred target material), substrate size about 1.5 by 1.5 inches with a distance of about 21 inches from the target, and the thickness of the alignment layer about 40 nm and a nematic LC mixture MLC 95–465 from E. M. Merck, Darmstadt, Germany, and varied the evaporation angle. The measured pre-tilt angle as a function of evaporation angle for each of the exemplary liquid crystal mixtures is shown in curves 50 and 51 of FIG. 3. It was discovered that, with the evaporation angle between 30° to 50°, a relatively uniform pre-tilt angle can be achieved for practical use.

The present invention is not only applicable to single-domain transmissive-type or reflective-type, but also is applicable to multi-domain transmissive-type or reflective-type homeotropic liquid crystal display.

Figures 4A, 4B:
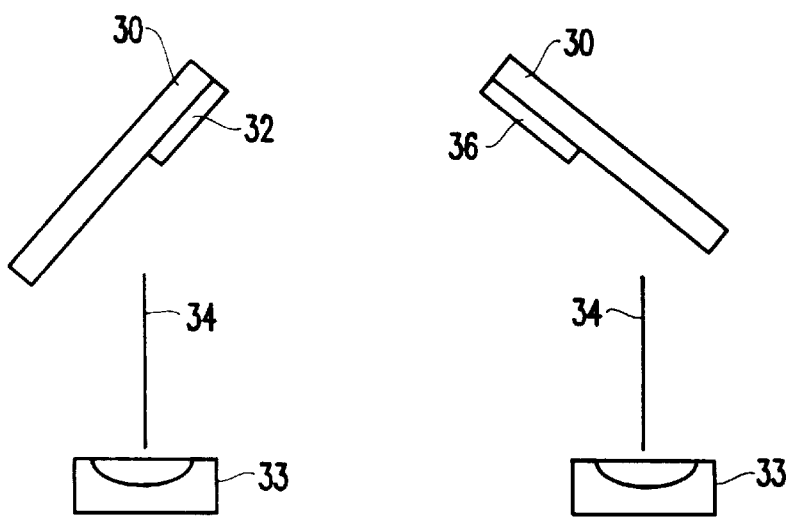
FIG. 4 is a pictorial illustration of generating alignment layers forming a two-domain tilted homeotropic liquid crystal display driven by active matrices.

As an example for the application to a two-domain homeotropic liquid crystal display, the preparation methods for forming the alignment layers for each domain within the two-domain unit cell are shown in FIGS. 4(a) and 4(b), respectively.

In FIG. 4(a), a substrate 30 with right-hand-side domains of two-domain unit cells covered by a mechanical or a photo-lithographic mask 32 is tilted leftwardly with respect to the evaporation direction 34. Then, a single oblique evaporation of silicon dioxide is performed, to form the alignment layer for the left-hand-side domains of the two-domain unit cells. It is noted that the invention is not limited to coatings of silicon dioxide and that other coating could also be suitably employed. For example, MgF, $SiN_x$, $SiO_x$, $Al_2O_3$, amorphous C:H, amorphous Si:H, and other inorganic materials can be employed.

For the alignment of the right-hand-side domains of two-domain unit cells, a second oblique evaporation of silicon dioxide is performed under the conditions that the mask position is changed from the FIG. 4(a) position to that shown in FIG. 4(b) to cover the left-hand-side domains of the two-domain unit cells, and the substrate plane tilted right with respect to the evaporation direction.

For those skilled in the art, the two-domain tilted homeotropic liquid crystal display device can also be fabricated using only one mask, as shown by mask 36 in FIG. 4(b) whereby the mask 32 in FIG. 4(a) can be omitted. The extension from a two-domain to a four-domain tilted homeotropic liquid crystal display is obvious for those ordinarily skilled in the art by using two more masks with correspondingly two more oblique evaporations of oxide with a suitable angle of evaporation for each mask.

Second Embodiment

Figure 3:
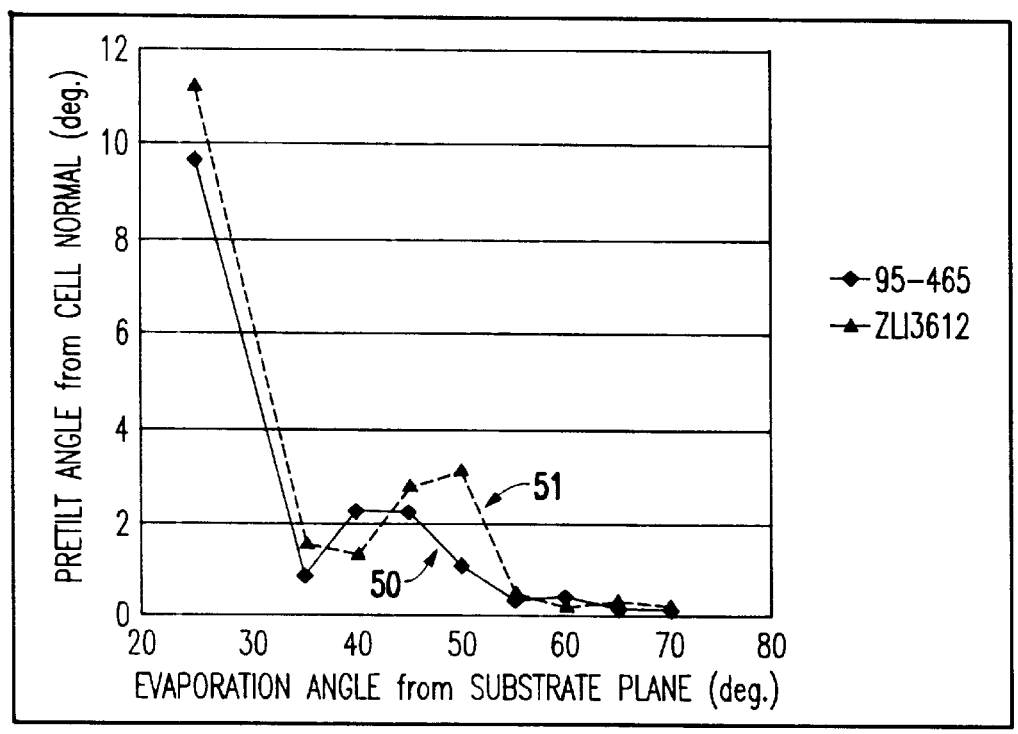
FIG. 3 illustrates the pre-tilt angle from the cell normal as a function of the evaporation angle from the substrate plane for each of the exemplary liquid crystal mixtures.

The tilted homeotropic-alignment method according to the invention as disclosed in the present application also can produce homeotropic-alignment, as shown in FIG. 3 at an evaporation angle between 65°–90°. By "homeotropic alignment", it is meant that the liquid crystal molecule aligns within about 0.5° from the cell normal. Such an alignment film to form a homeotropically-aligned LCD can be provided by plasma-enhanced chemical vapor deposition (PECVD), chemical vapor deposition (CVD), sputtering and the like.

The homeotropic-alignment method according to the invention, as disclosed herein, is also applicable to the cases disclosed by Obimura et al. (SID'97 Digest of Tech. Papers, 27 (1997)461) for the fabrication of four-domain or automated domain formation tilted homeotropic liquid crystal displays, and by Lien et al. (Japanese Journal of Applied Physics, Vol.37, No. 5B, L597-599(1998)) for the fabrication of ridge and fringe field multi-domain homeotropic liquid crystal displays.

In the above two publications, a polyimide or a polyamide film was coated on the cell substrates to achieve the homeotropic alignment of liquid crystal. The polyimide or polyamide film can be replaced by a single evaporation of oxide film according to the invention disclosed in the present application, with an evaporation angle of about 10° to about 90° being employed.

For those ordinarily skilled in the art, the single oblique evaporation of oxide according to the present invention, as disclosed in the present application, can be modified to include the ion-beam assisted single oblique evaporation of oxides where an ion beam, such as an oxygen ion beam, impinges on the substrate locations which are receiving or have received the oxide film from evaporation sources.

The present invention also includes single oblique sputtering of $SiO_2$ (e.g., as the film coatings) onto substrates using the apparatuses disclosed in U.S. Pat. No. 5,658,439, incorporated herein by reference, to form the tilted homeotropic-alignment layer for liquid crystals. The inventive method results in a much better photo-stability (e.g., 10 times better in some observed cases) that the conventional polyimide alignment method.

The present invention also includes deposited dielectric alignment films such as $SiO_2$, $SiO_x$, $SiN_x$, ZnO, $TiO_2$, $GeO_2$, SiC, amorphous Si:H, amorphous-C:H by sputtering, CVD, and/or PECVD, to produce homeotropic or tilted homeotropic alignment for liquid crystals with negative dielectric anisotropy.

Figure 5A:
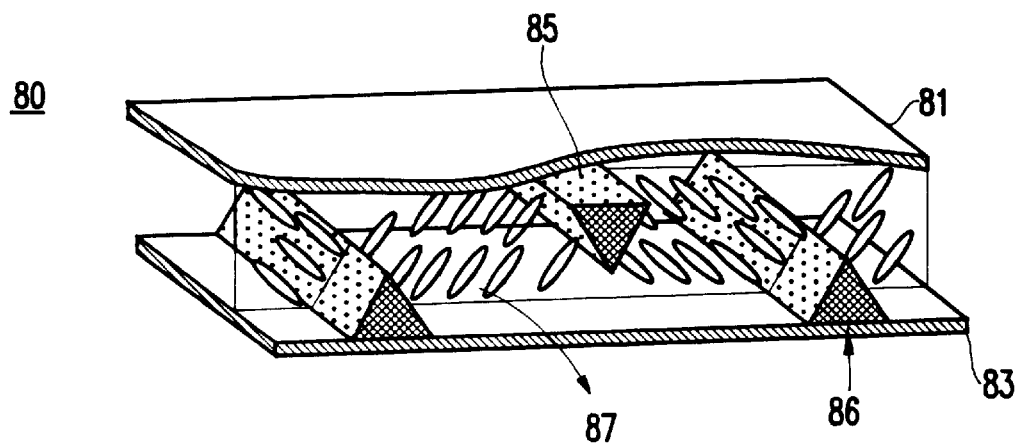
FIGS. 5A–5B illustrate a structure for a multidomain LCD, and more specifically
Figure 5B:
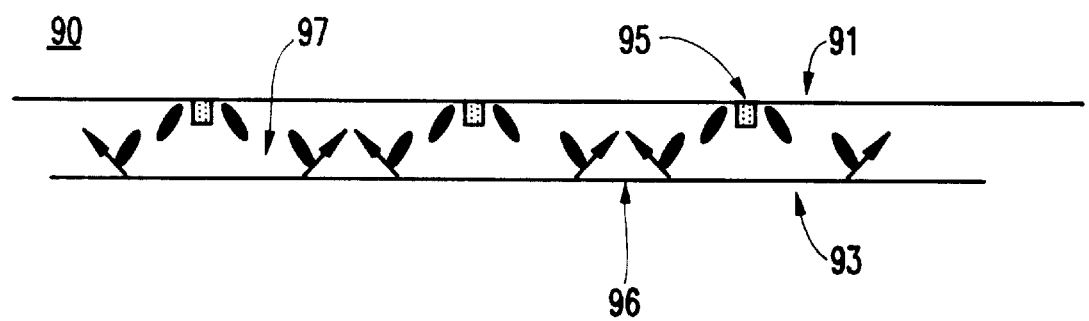

In the second embodiment of the invention, as shown in FIGS. 5A–5B, a multi-domain liquid crystal device is provided which includes a substrate with an electrode having at least one of protruding bumps of insulating material thereon and etched away stripes. A homeotropic- or tilted homeotropic-alignment film is formed on the substrate. The homeotropic- or tilted homeotropic-alignment film includes a single evaporation oxide formed on the substrate. A nematic liquid crystal mixture, adjacent the homeotropic or tilted homeotropic-alignment film and for being aligned by the film, has a negative dielectric anisotropy.

Specifically, in FIG. 5A, a protrusion (or ridge-like) structure 80 is shown having a plurality (e.g., two being shown) of protrusions on first and second substrates. That is, the structure 80 includes first and second substrates 81, 83 for a liquid crystal display (LCD) device. Protrusions 85 are formed on the first (e.g., top) substrate 81, and protrusions 86 are formed on the second (e.g., bottom) substrate 83. A nematic liquid crystal mixture 87 having a negative dielectric anisotropy is provided between the substrates 81, 83. An alignment layer (e.g., formed of $SiO_2$ or the like as discussed above; not shown) is used to produce the homeotropic alignment for the liquid crystals.

Turning to FIG. 5B, another structure is shown in which protrusions or ridges are formed on one substrate and etched away stripes are formed on another substrate. Specifically, a structure 90 is shown having first and second electrodes 91, 93 for the liquid crystal display (LCD) device. Electrode 91 is a continuous electrode on the first substrate (e.g., top substrate) of the LCD, whereas electrode 93 is an isolated pixel electrode formed on the bottom substrate of the LCD. Protrusions 95 are formed on the electrode 91. A nonconducting gap 96 is formed between pixel electrodes 91, as shown,. A nematic liquid crystal mixture 97 having a negative dielectric anisotropy is provided between the electrodes 91, 93. An alignment layer (e.g., formed of $SiO_2$ or the like as discussed above; not shown) is used to produce the homeotropic alignment for the liquid crystals.

A benefit of the second embodiment over that of the first embodiment is that such as structure provides a pre-tilt angle by a sloping profile (e.g., protruding bumps) or etched away stripes (e.g., a fringe field effect). The control of the pre-tilt angle is more accurate with the second embodiment. In addition, it will automatically generate a multi-domain structure, and results in a very large viewing angle.

Thus, the present invention provides a photo-stable homeotropic-alignment or tilted homeotropic-alignment liquid crystal display unit (and method of producing the same) which is free from the occurrence of alignment non-uniformity both in the inactivated state and in the activated state, and which has a high contrast ratio and is easily and efficiently produced.

While the invention has been described in terms of several preferred embodiments, those skilled in the art will recognize that the invention can be practiced with modification within the spirit and scope of the appended claims.

For example, the invention can be advantageously employed in displays, including projection systems displays and "direct view" monitors relying on cathode ray tube (CRT) technology and the like.

What is claimed is:

1. A liquid crystal display device, comprising:
   a substrate;
   a homeotropic-alignment film formed on said substrate and comprising a single oblique evaporation film, said substrate being nonrotating during a formation of said homeotropic-alignment film; and
   a nematic liquid crystal mixture which is adjacent said tilted homeotropic alignment film, has a negative dielectric anisotropy, and is aligned by said homeotropic alignment film without using a homeotropic alignment agent,
   wherein said single oblique evaporation film has an evaporation angle between the substrate plane and the evaporation direction which is between about 5° and 45° or between about 70° and 90°.

2. The device according to claim 1, wherein said film comprises a dielectric material comprising at least one of MgF, $SiN_x$, $SiO_x$, $Al_2O_3$, ZnO, $TiO_2$, $GeO_2$, SiC, amorphous C:H, and amorphous Si:H.

3. The device according to claim 1, wherein said homeotropic-alignment film comprises a tilted homeotropic-alignment film.

4. The device according to claim 1, wherein said single oblique evaporation has a distance between said substrate and a target source which is greater than 10 inches.

5. A tilted homeotropic-alignment liquid crystal display device of either transmissive-type or reflective-type, comprising:
   a substrate;
   a tilted homeotropic-alignment film formed on said substrate, said substrate being nonrotating during a formation of said tilted homeotropic-alignment film; and
   a nematic liquid crystal mixture, adjacent said tilted alignment film, having a negative dielectric anisotropy and being aligned by said homeotropic alignment film without using a homeotropic alignment agent,
   wherein said tilted homeotropic-alignment film comprises a dielectric film deposited on the substrate by a single oblique evaporation of said dielectric film at least one of heated by a thermal source, activated by an electron beam, and activated by an ion beam,
   wherein said single oblique evaporation film has an evaporation angle between the substrate plane and the evaporation direction which is between about 5° and 45° or between about 70° and 90°.

6. The device according to claim 5, wherein said dielectric film has a thickness substantially within a range of about 2 nm to about 200 nm.

7. The device according to claim 5, wherein said dielectric film comprises an $SiO_2$ film.

8. The device according to claim 7, wherein said $SiO_2$ film has a thickness substantially within a range of about 2 nm to about 200 nm.

9. The device according to claim 8, wherein said $SiO_2$ film has a thickness substantially within a range of about 10 nm to about 100 nm.

10. A tilted homeotropic-alignment liquid crystal display device of either transmissive-type or reflective-type, comprising:
    a substrate;
    a tilted homeotropic-alignment film formed on said substrate, said substrate being nonrotating during a formation of said tilted homeotropic-alignment film; and a nematic liquid crystal mixture which is adjacent said tilted homeotropic alignment film, has a negatice dielectric anisotropy, and is aligned by said homeotropic alignment film without using a homeotropic alignment agent, wherein said tilted homeotropic-alignment film comprises a dielectric film deposited on said substrate by at least one of sputtering chemical vapor deposition (CVD), and plasma-enhanced chemical vapor deposition (PECVD), wherein said, homeotropic-alignment film is formed of a single oblique evaporation having an evaporation angle between the substrate plane and the evaporation direction which is between about 5° and 45° or between about 70° and 90°.

11. The device according to claim 10, wherein said dielectric comprises at least one of $SiO_x$, $SiN_x$, MgF, $Al_2O_3$, ZnO, $TiO_2$, $GeO_2$, SiC, amorphous CiH, and amorphous Si:H.

12. A method of producing a tilted homeotropic-alignment liquid crystal display device of either transmissive-type or reflective-type having a substrate coated with a tilted homeotropic-alignment film, comprising:

providing a thin-film deposition system having an evaporation source;

holding a substrate obliquely within the thin-film deposition system such that a line normal to the substrate and the evaporation source form an oblique angle; and activating the evaporation source, thereby forming a dielectric film on the substrate for aligning the tilted homeotropic liquid crystal display device without using a homeotropic alignment agent, said substrate being nonrotating during a formation of said dielectric film, wherein said dielectric film is formed of a single oblique evaporation having an evaporation angle between the substrate plane and the evaporation direction which is between about 5° and 45° or between about 70° and 90°.

13. The method according to claim 12, wherein said dielectric film comprises a $SiO_2$ film.

14. The method according to claim 13, wherein said $SiO_2$ film has a thickness substantially within a range of about 2 nm to about 200 nm.

15. The method according to claim 14, wherein said $SiO_2$ film has a thickness substantially within a range of about 20 nm to about 100 nm.

16. The method according to claim 12, wherein said dielectric film has a thickness substantially within a range of about 2 nm to about 200 nm.

17. A liquid crystal display device, comprising:

a display having a plurality of display pixels, each display pixel being divided into first-hand-side and second-hand-side half pixels being coated with a tilted homeotropic-alignment film such that the first-hand-side half pixels is covered with a first mask and the second-hand-side half pixels are coated with a first tilted homeotropic-alignment film, where said first tilted homeotropic-alignment film comprises an inorganic film formed on a nonrotating substrate by a first oblique evaporation of an inorganic source, wherein the substrate plane is tilted in a second direction such that from the evaporation direction toward the second-hand-side edge of the substrate forms an acute angle, and wherein subsequently said first mask is removed and the second-hand-side half pixels are covered by a second mask and the first-band-side half pixels coated with a second tilted homeotropic-alignment film, wherein said second tilted homeotropic-alignment film comprises an inorganic film deposited on the nonrotating substrate by a second oblique evaporation of an inorganic source, wherein the substrate plane is tilted in first direction opposite that of said second direction, such that from the evaporation direction toward the first-hand-side edge of the substrate forms an acute angle, said display further comprising a nematic liquid crystal mixture adjacent said first and second homeotropic-alignment films and for being aligned by said first and second homeotropic-alignment films without using a homeotropic alignment agent, said liquid crystal mixture having a negative dielectric anisotropy.

18. The device according to claim 17, wherein said inorganic film has a thickness substantially within a range of about 2 nm to about 200 nm.

19. The device according to claim 17, wherein said inorganic film comprises a dielectric film formed of at least one of silicon dioxide, MgF, $SiN_x$, $SiO_x$, $Al_2O_3$, ZnO, $TiO_2$, $GeO_2$, SiC, amorphous C:H, and amorphous Si:H.

20. The device according to claim 19, wherein said inorganic film has a thickness substantially within a range of about 2 nm to about 200 nm.

21. The device according to claim 20, wherein said inorganic film has a thickness substantially within a range of about 10 nm to about 100 nm.

22. The device according to claim 17, wherein said inorganic film comprises an oxide, said single oblique evaporation of the oxide source has an evaporation angle representing an angle between the substrate plane and the evaporation direction, said evaporation angle being substantially within a range of about 5° to 45°.

23. The device according to claim 22, wherein said evaporation angle is substantially within a range of about 70° to 90°.

24. The device according to claim 17, wherein said first mask and said second mask comprise a same mask.

25. A multi-domain homeotropic-alignment liquid crystal display device of either transmissive-type or reflective-type, comprising:

a substrate;

an electrode, formed on said substrate and having at least one of protruding bumps of insulating material and etched-away stripes thereon;

a homeotropic-alignment film formed on said electrode, said substrate being nonrotating during a formation of said homeotropic-alignment film; and a nematic liquid crystal mixture which is adjacent said homeotropic-alignment film, has a negative dielectric anisotropy, and is aligned by said homeotropic alignment film without using a homeotropic alignment agent, wherein said homeotropic-alignment film comprises a dielectric film formed on said electrode by at least one of sputtering plasma-enhanced chemical vapor deposition (PECVD), chemical vapor deposition (CVD), and another thin film deposition process, wherein said dielectric film is formed of a single oblique evaporation having an evaporation angle between the substrate plane and the evaporation direction which is between about 5° and 45° or between about 70° and 90°.

26. A process of producing a liquid crystal display device, comprising:

provide a display having a plurality of display pixels;

dividing each display pixel into first-side and second-side half pixels;

covering the first-side half pixels with a first mask, and coating the second-side half pixels with a first tilted homeotropic-alignment film, said first tilted homeotropic-alignment film comprising an inorganic film formed on a nonrotating substrate by a first oblique evaporation of an inorganic source, wherein the substrate plane is tilted in predetermined direction such that from the evaporation direction toward the second-side edge of the substrate forms an acute angle;

subsequently removing said first mask and covering the second-side half pixels with a second mask and coating the first-side half pixels with a second tilted homeotropic-alignment film, wherein said second tilted homeotropic-alignment film comprises an inorganic film deposited on the nonrotating substrate by a second oblique evaporation of an inorganic source, wherein the substrate plane is tilted in another predetermined direction such that from the evaporation direction toward the first-side edge of the substrate forms an acute angle; and forming a nematic liquid crystal mixture adjacent to said first and second tilted homeotropic alignment films, said nematic liquid crystal mixture having a negative dielectric anisotropy and being aligned by said first and second tilted homeotropic alignment films without using a homeotropic alignment agent.

27. The process according to claim 26, wherein said inorganic film comprises a dielectric film formed of at least one of silicon dioxide, MgF, $SiN_x$, $SiO_x$, $Al_2O_3$, ZnO, $TiO_2$, $GeO_2$, SiC, amorphous C:H, and amorphous Si:H.

28. The process according to claim 1, wherein said first mask and said second mask comprise a same mask.

29. A homeotropic alignment liquid crystal display device of either transmissive-type or reflective type comprising:

a substrate;

a homeotropic-alignment film formed on said substrate, said substrate being nonrotating during a formation of said tilted homeotropic-alignment film; and a nematic liquid crystal mixture which is adjacent said homeotropic alignment film, has a negative dielectric anisotropy, and is aligned by said homeotropic alignment film without using a homeotropic alignment agent, wherein said homeotropic-alignment film comprises a dielectric film deposited on said substrate by at least one of sputtering, chemical vapor deposition (CVD), plasma-enhanced chemical vapor deposition (PECVD), and evaporation, wherein said dielectric film is formed of a single oblique evaporation having an evaporation angle between the substrate plane and the evaporation direction which is between about 5° and 45° or between about 70° and 90°.

30. The device according to claim 29, wherein said dielectric comprises at least one of MgF, $SiN_x$, $SiO_x$, $Al_2O_3$, ZnO, $TiO_2$, $GeO_2$, SiC, amorphous C:H, and amorphous Si:H.

31. A multi-domain homeotropic-alignment liquid crystal display device of either transmissive-type or reflective-type, comprising:

a substrate;

an electrode, formed on said substrate and having at least one of protruding bumps of insulating material and etched-away stripes thereon;

a homeotropic-alignment film formed on said electrode, said substrate being nonrotating during a formation of said homeotropic-alignment film; and a nematic liquid crystal mixture which is adjacent said homeotropic-alignment film, has a negative dielectric anisotropy, and is aligned by said homeotropic alignment film without using a homeotropic alignment agent, wherein said homeotropic-alignment film comprises a dielectric film deposited on said electrode by a single oblique evaporation of a dielectric one of heated by a thermal source, activated by an electron beam, and activated by an ion beam, wherein said dielectric film is formed of a single oblique evaporation having an evaporation angle about 5° and 45° or between about 70° and 90°.

32. The device according to claim 31, wherein said dielectric film has a thickness substantially within a range of about 2 nm to about 200 nm.

33. The device according to claim 31, wherein said dielectric film comprises an $SiO_2$ film.

34. The device according to claim 33, wherein said $SiO_2$ film has a thickness substantially within a range of about 2 nm to about 200 nm.

35. A multi-domain liquid crystal device, comprising:

a substrate;

an electrode, formed on said substrate and having at least one of protruding bumps of insulating material and etched away stripes;

a homeotropic-alignment film formed on said electrode and comprising a single evaporation film, said substrate being nonrotating during a formation of said homeotropic-alignment film, and a nematic liquid crystal mixture which is adjacent said homeotropic-alignment film, has a negative dielectric anisotropy, and is aligned by said homeotropic alignment film without using a homeotropic alignment agent, wherein said single evaporation film is formed of a single oblique evaporation having an evaporation angle between the substrate plane and the evaporation direction which is between about 5° and 45° or between about 70° and 90°.

* * * * *